United States Patent
Cok et al.

(10) Patent No.: US 7,710,022 B2
(45) Date of Patent: May 4, 2010

(54) EL DEVICE HAVING IMPROVED POWER DISTRIBUTION

(75) Inventors: Ronald S. Cok, Rochester, NY (US); Michael E. Miller, Honeoye Falls, NY (US)

(73) Assignee: Global Oled Technology LLC, Wilmington, DE (US)

( * ) Notice: Subject to any disclaimer, the term of this patent is extended or adjusted under 35 U.S.C. 154(b) by 1134 days.

(21) Appl. No.: 11/341,945

(22) Filed: Jan. 27, 2006

(65) Prior Publication Data

US 2007/0176859 A1    Aug. 2, 2007

(51) Int. Cl.
*H01L 51/50* (2006.01)
*H01L 51/52* (2006.01)
*G09G 3/30* (2006.01)

(52) U.S. Cl. ............... 313/505; 313/503; 313/500; 315/169.3; 345/76; 345/77; 345/92

(58) Field of Classification Search ......... 313/500–512; 345/76, 77, 92; 315/169.3
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 6,011,531 A * | 1/2000 | Mei et al. | 345/92 |
| 6,392,340 B2 | 5/2002 | Yoneda et al. | |
| 6,453,067 B1 * | 9/2002 | Morgan et al. | 382/162 |
| 6,522,079 B1 | 2/2003 | Yamada | |
| 6,724,149 B2 | 4/2004 | Komiya et al. | |
| 6,762,564 B2 | 7/2004 | Noguchi et al. | |
| 6,771,028 B1 | 8/2004 | Winters | |
| 6,919,681 B2 | 7/2005 | Cok et al. | |
| 2004/0004444 A1 | 1/2004 | Choi et al. | |

(Continued)

OTHER PUBLICATIONS

C.W. Tang, S.A. VanSlyke, and C.H. Chen; "Electroluminescence Of Doped Organic Thin Films"; Journal of Applied Physics; vol. 65; No. 9; May 1, 1989; pp. 3610-3616.

C.W. Tang and S.A. VanSlyke; "Organic Electroluminescent Diodes"; Applied Physics Letters; vol. 51; No. 12; Sep. 21, 1987; pp. 913-915.

*Primary Examiner*—Mariceli Santiago
(74) *Attorney, Agent, or Firm*—Morgan Lewis & Bockius LLP

(57) ABSTRACT

An active-matrix electroluminescent device, comprising: a plurality of light-emitting elements laid out over a substrate, a plurality of electrical buses carrying a common signal connected to the light-emitting elements; and a plurality of electrical cross-connections intersecting and electrically connecting the plurality of electrical buses. The plurality of light-emitting elements are arranged in groups of four light-emitting elements each, each group forming a quad cell of four neighboring light-emitting elements arranged around intersections of the electrical buses and cross-connections, each of the light-emitting elements of each quad cell are connected to the electrical bus or electrical cross-connection separating the light-emitting elements of the quad cell, each quad cell shares a common electrical bus or cross-connection with an adjacent quad cell, and adjacent quad cells sharing a common electrical bus are not separated by a common cross-connection and neighboring quad cells sharing a common cross-connection are not separated by a common electrical bus.

12 Claims, 9 Drawing Sheets

U.S. PATENT DOCUMENTS

2004/0108978 A1 6/2004 Matsueda et al.
2004/0113875 A1 6/2004 Miller et al.
2004/0178974 A1 9/2004 Miller et al.
2004/0257312 A1 12/2004 Koyama et al.

* cited by examiner

EL DEVICE HAVING IMPROVED POWER DISTRIBUTION

FIELD OF THE INVENTION

The present invention relates to electroluminescent devices, and more particularly, to electroluminescent device structures for improving power distribution.

BACKGROUND OF THE INVENTION

Coated electroluminescent (EL) devices are a promising technology for flat-panel displays and area illumination lamps. Advances in EL devices, particularly within the subcategory of organic light-emitting diodes (OLEDs), are making this technology competitive with traditional LCD technology for display and tungsten or fluorescent bulbs for area illumination. This technology relies upon thin-film layers of materials coated upon a substrate. In OLED devices, these materials are organic but EL devices may also be formed from inorganic or combinations of organic and inorganic layers.

OLED devices generally can have two formats known as small-molecule devices such as are disclosed in U.S. Pat. No. 4,476,292 and polymer OLED devices such as are disclosed in U.S. Pat. No. 5,247,190. Either type of OLED device may include, in sequence, an anode, an organic EL element, and a cathode. In most designs, one of the electrodes is reflective and the other transparent. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron-transport layer (ETL) and the hole-transport layer (HTL) and recombine in the light-emissive layer (LEL). Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of LEL can determine how efficiently the electrons and holes can be recombined and result in the emission of light, etc.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer and transparent cover. Light generated from the device is emitted through the top transparent electrode and transparent cover. This is commonly referred to as a top-emitting device.

OLED devices can employ a variety of light-emitting organic materials patterned over a substrate that emit light of a variety of different wavelengths, for example red, green, and blue, to create a full-color display. Alternatively, it is known to employ a combination of emitters, or an unpatterned broadband emitter, to emit white light, together with patterned color filters, for example red, green, and blue, to create differently colored light emitting elements and a full-color display. The color filters may be located on the substrate, for a bottom-emitter, or on the cover, for a top-emitter. For example, U.S. Pat. No. 6,392,340 entitled "Color Display Apparatus having Electroluminescence Elements" issued May 21, 2002 illustrates such a device.

OLED materials have different light-emission properties, and it is known that some colors of light are emitted more efficiently than others, in particular white emitters are known that have an efficiency higher than that of both blue and red emitters. Hence, it has been proposed to employ OLED pixels having four sub-elements: red, green, blue, and white (RGBW). Because most images have a large luminance component, such four-element displays can be more efficient than conventional three-element displays. Such designs are described, for example, in U.S. Pat. No. 6,919,681 and US2004/0113875. In some cases, the white emitters may be more efficient than the color emitters, hence power usage may be reduced by using the white emitter to replace a portion of the light emitted by a combination of the colored emitters. Additionally, it is known that the application of a fourth gamut defining color light-emitting element having a power efficiency higher than at least one of the RGB light-emitting elements can also improve display efficiency as described in US20040178974.

Referring to FIG. 3, a side view of a bottom-emitting OLED device as suggested by the prior art is illustrated having a transparent substrate 50. Over the substrate 50, a semiconducting layer is formed providing thin-film electronic components 24 for driving an OLED. An interlayer insulating and planarizing layer 40 is formed over the thin-film electronic components 24 and a patterned transparent electrode 52 defining OLED light-emissive elements is formed between the insulating layers 40. An inter-light-emitting element insulating film 42 separates the elements of the patterned transparent electrode 52. One or more first layers 54 of organic material, one of which emits light, are formed over the patterned transparent electrode 52. A reflective second electrode 56 is formed over the one or more first layers 54 of organic material. In some prior-art embodiments, the patterned transparent electrode 52 may instead be at least partially transparent and/or light absorbing.

As shown in the RGBW configuration of FIG. 3, the organic layers 54 need not be patterned, and broadband light, for example white light, can be emitted from the organic layers 54, through the color filters 44R, 44G, and 44B to form a color display. The color filters 44R, 44G, and 44B, transmit only a desired color of light, for example red, green, and blue corresponding, for example to the desired colors in a color display while filter 44K is a neutral density filter (or a transparent layer, no filter, may be present). The colored light 60, 61, 62 and broadband, or white, light 63 then passes through the substrate 50 and is emitted from the device. Alternatively, the organic layers 54 may be patterned so that differently colored light is emitted from different locations on the device and no filters 44R, 44G, and 44B need be employed. The Applicant has constructed an OLED device, corresponding to FIG. 3.

Unlike other flat-panel display devices, active-matrix OLED devices employing thin-film electronic components to drive the OLED elements generally suffer from problems with power distribution in the OLED device. Since the OLED devices are directly emissive and the light output is dependent on the current passing through the OLED, it is important that adequate and uniform current be available to each OLED in an active-matrix OLED device.

OLED devices are traditionally laid out with rows and columns of pixels and either column or row buses supplying power to each OLED pixel so that each column (or row) of pixels share a common bus (as well as other signals such as data and select). This arrangement is employed to simplify the layout of the pixels and maximize the resolution of the OLED device. In an active-matrix OLED, a thin-film transistor circuit is provided that regulates the current provided to each OLED within the display device. However, current is typically commonly provided to a large number of pixels in a row or column by a power and return line pair. Because these lines have a finite resistance, as the current that is required to drive each OLED element increases, an unintended and undesirable voltage differential is produced as a function of the current that is drawn and the resistance of the power and return line. Since the unintended voltage differential is positively correlated with current and resistance, the loss of voltage along the power and/or return line will be large when the lines must deliver high currents or when the power line has a high resistance. The phenomena that produces this unintended voltage differential is commonly referred to as current-resistance or "IR" drop. Further, this IR drop will result in the gradual loss of luminance for pixels along a power line as the distance from the power source increases. This loss of luminance has the potential to create undesirable imaging artifacts. Therefore, there is a need to limit unintended voltage drop to avoid these artifacts. Referring to FIGS. 6A and 6B, diagrams are presented illustrating an actual image artifact observed in a commercially-available active-matrix OLED. Area 1 is brightly illuminated and therefore draws a significant amount of power. Area 2, including portions 2*a*, is less brightly illuminated with a common signal and is located farther from the power source than area 1 so that current must pass a greater distance through the column buses found in the active-matrix OLED employed for the demonstration. Although area 2*a* is driven with the same signal used to drive the remainder of area 2, the current in area 2*a* is differentially limited by the current drawn along the column bus in area 1 and therefore exhibits a lower luminance than in the remainder of area 2, leading to an observable, unintended, and undesirable image artifact. In particular, the artifact is column-structured and is defined by the layout of the power and return line within the display device.

One method to overcome this problem is to reduce the resistance of the power lines as suggested in US 2004/0004444, entitled "Light-emitting panel and light-emitting apparatus having the same". Buses are typically constructed, for example, of aluminum or silver or other metals or metal alloys and may be, for example, 10 microns wide and 250 nm thick. Unfortunately, since the materials that are available to reduce resistance and the cross-sectional area of the power line, which is inversely proportional to resistance, is fixed by the manufacturing technology that is available, it is often not cost effective to reduce the resistance of the power line. Since resistance increases with increases in the length of the power line and the peak luminance of the display is limited by the peak current that can be provided along a power line, this phenomena often limits the size or luminance of displays that can be produced using OLED technology.

Another prior-art method to address this problem relies upon increasing the size of the power-distribution buses at the expense of other display elements. For example, the buses can be increased in size (and their conductivity improved) by reducing the size of the emissive areas of an OLED (the aperture ratio). However, this reduces the lifetime of the OLED device since the current density through the OLED materials is increased (at a given luminance) and it is known that the lifetime of an OLED is inversely related to the current density passed through the OLED. Referring to FIG. 4A, a top view of a conventional prior-art OLED layout is shown comprising two neighboring pixels 10*a* and 10*b*, with light-emissive areas 20*a* and 20*b*, thin-film electronic (TFT) electronic components 24*a* and 24*b* and buses 14*a* and 14*b*. Because of manufacturing process limitations, the precision with which the various components can be located is limited; therefore spacing 8 must be employed between the various device elements. A great variety of layout design rules and layers is known in the art and define the spacing 8 that may be considered for the various device elements. The figures shown are a very simplified and abstracted illustration. In particular, note the spacing 8 adjoining the buses 14; two spaces 8 are employed within each pixel 10. U.S. Pat. No. 6,522,079 describes an OLED layout with improved bus width without reducing the aperture ratio. Referring to FIG. 4B, by reducing the number of buses, the number of spaces 8 can be reduced to three between every two pixels. The additional space 14' can be employed to increase the size of the remaining bus (as shown) to improve conductivity and power distribution, or for other purposes such as increased aperture ratio and OLED device lifetime. U.S. Pat. No. 6,771,028 describes drive circuitry for four-color organic light emitting devices, and similarly includes reflected layout embodiments where adjacent columns of light-emitting elements share a common electrical bus. Despite this increase in size and conductivity enabled by such layouts, power distribution remains a significant problem and further improvements would be desirable.

Referring to FIG. 4C, another approach to improving the power distribution of an OLED device employing row or column buses is described in U.S. Pat. No. 6,724,149. This design uses bypass cross-connectors 12*a* and 12*b* electrically connecting buses 14 to allow current from one bus 14 to reach another. However, use of such cross connections between each row of light-emitting elements may significantly reduce the aperture ratio of an OLED device, particularly in a bottom-emitter OLED configuration.

Because all EL devices, including OLED devices, produce light as a function of the current that passes through the device, all active matrix EL devices exhibit similar problems. There is a need therefore for an improved EL device layout that avoids the problems noted above, providing either a larger area for power bus lines and/or emitting area while reducing the visibility of artifacts.

SUMMARY OF THE INVENTION

In accordance with one embodiment, the invention is directed towards an active-matrix electroluminescent device, comprising:

a plurality of light-emitting elements laid out over a substrate, each light-emitting element including a first electrode and a second electrode having one or more electroluminescent layers formed there-between, at least one electroluminescent layer being light-emitting, at least one of the electrodes being transparent and the first and second electrodes defining one or more light-emissive areas, and electronic components formed on the substrate connected to the first and/or second electrodes for driving the one or more electroluminescent layers to emit light;

a plurality of electrical buses carrying a common signal connected to the light-emitting elements;

a plurality of electrical cross-connections intersecting and electrically connecting the plurality of electrical buses;

wherein the plurality of light-emitting elements are arranged in groups of four light-emitting elements each, each group forming a quad cell of four neighboring light-emitting elements arranged around intersections of the electrical buses and cross-connections, two light-emitting elements of each quad cell being formed on each side of an electrical bus and two light-emitting elements of each quad cell being formed on each side of an electrical cross-connection; and wherein each of the light-emitting elements of each quad cell are connected to the electrical bus or electrical cross-connection separating the light-emitting elements of the quad cell, each quad cell shares a common electrical bus or cross-connection with an adjacent quad cell, and wherein adjacent quad cells sharing a common electrical bus are not separated by a common cross-connection and neighboring quad cells sharing a common cross-connection are not separated by a common electrical bus.

ADVANTAGES

The present invention has the advantage that it enables improved power distribution and light-emission uniformity of active-matrix electroluminescent devices.

It will be understood that the figures are not to scale since the individual elements have size differences too great to permit depiction to scale.

DETAILED DESCRIPTION OF THE INVENTION

Figure 1:
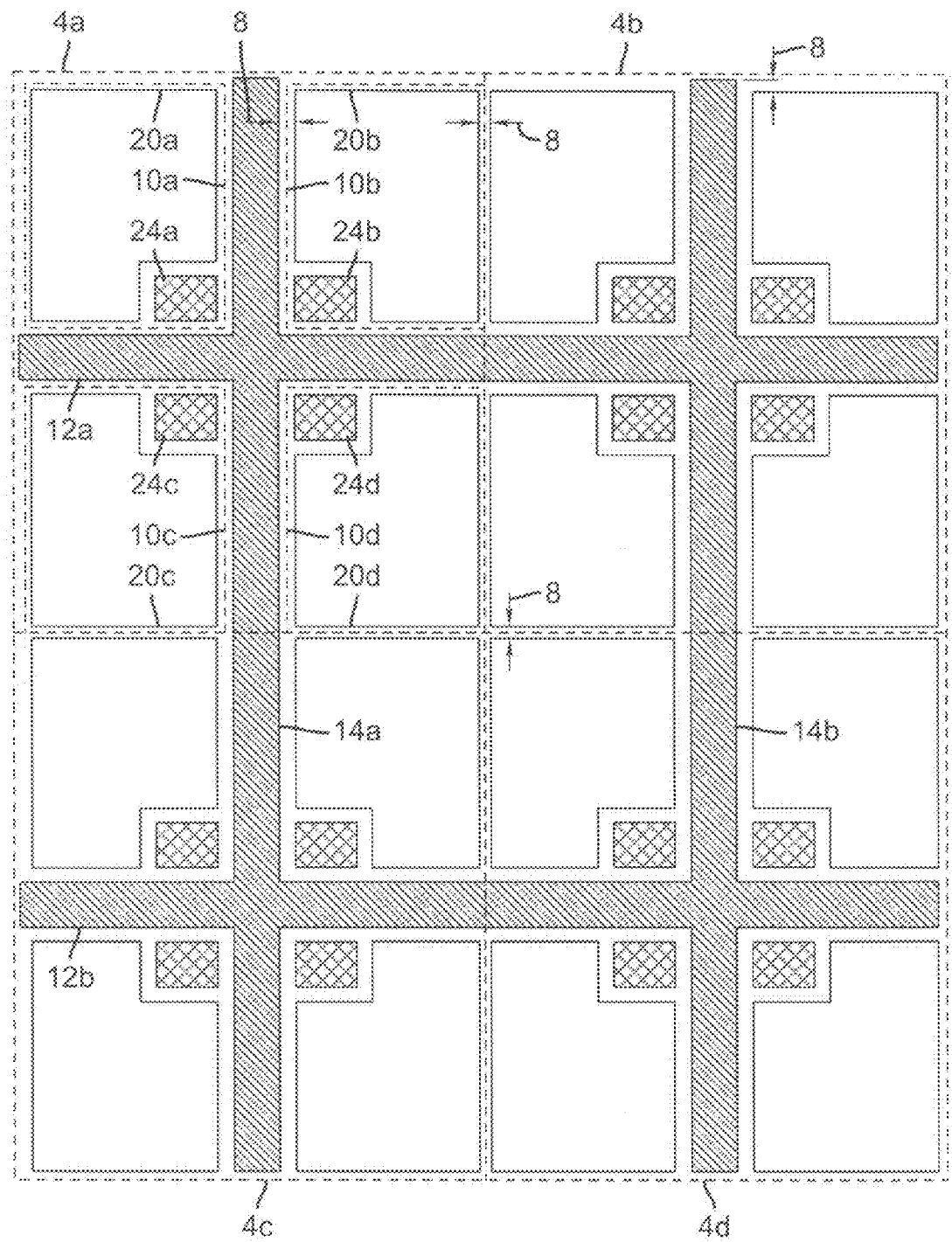
FIG. 1 illustrates a top view of an OLED device according to one embodiment of the present invention.
Figure 3:
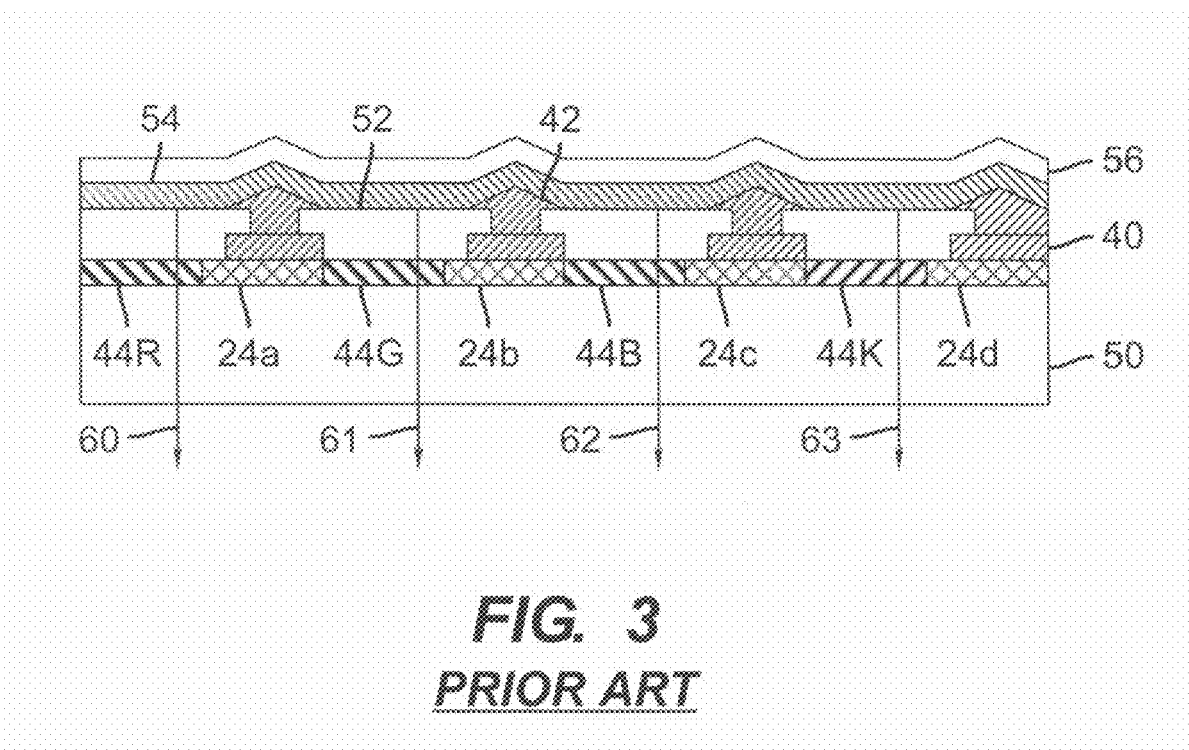
FIG. 3 illustrates side views of a bottom-emitting active-matrix OLED device as suggested in the prior art.
Figure 4A:
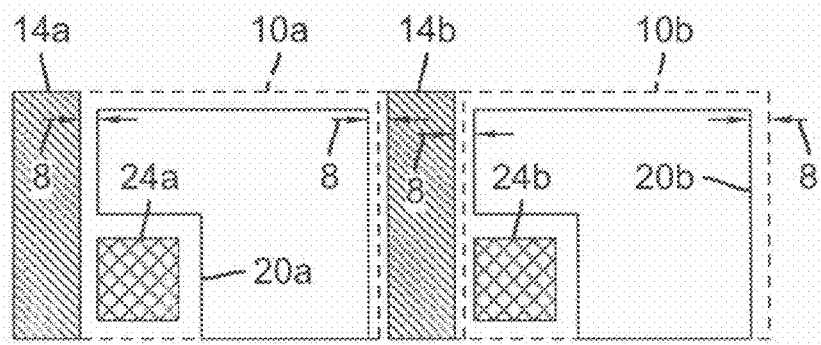
FIGS. 4A, 4B, and 4C illustrate top views of various active-matrix OLED device layouts known in the prior art.
Figure 4B:
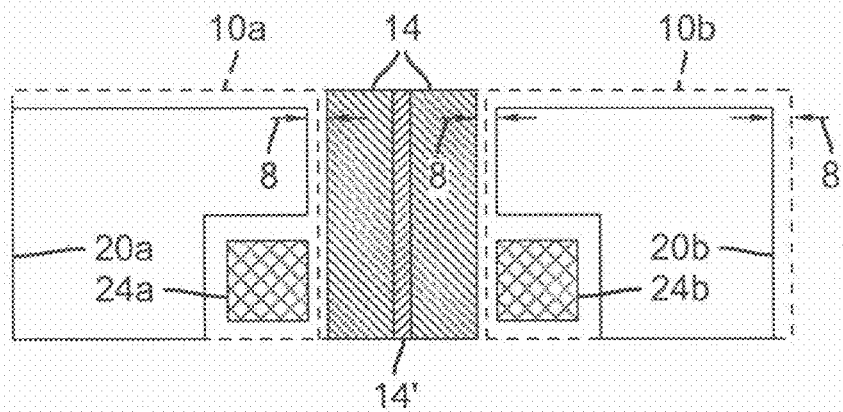
Figure 4C:
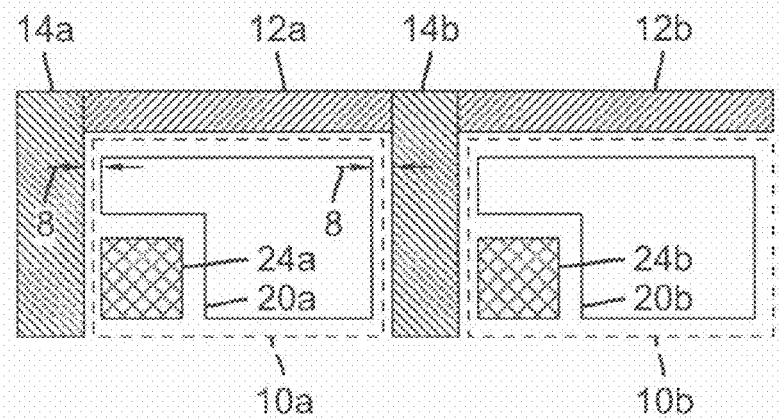

Referring to FIG. 1, in accordance with one embodiment of the present invention, an active-matrix electroluminescent device comprises a plurality of light-emitting elements 10a, 10b, 10c, and 10d laid out over a substrate. Referring to FIG. 3, the light-emitting elements may similarly be formed over a substrate 50, each OLED element including a first electrode 52 and a second electrode 56 having one or more electroluminescent layers 54 formed there-between, at least one electroluminescent layer 54 being light-emitting and at least one of the electrodes 52 and 54 being transparent, the first and second electrodes 52 and 56 defining one or more light-emissive areas. Further illustrated in FIG. 1, light-emitting elements 10a, 10b, 10c, and 10d include light-emissive areas 20a, 20b, 20c, and 20d, and electronic components 24a, 24b, 24c, and 24d formed on the substrate 50 connected to the first and/or second electrodes 52 and 56 for driving the one or more electroluminescent layers 54 to emit light.

A plurality of electrical buses 14a, 14b carrying a common signal are connected to the light-emitting elements, and a plurality of electrical cross-connections 12a, 12b intersect and electrically connect the plurality of electrical buses. The plurality of light-emitting elements are arranged in groups of four light-emitting elements each (10a, 10b, 10c, 10d), each group forming quad cell (4a, 4b, 4c, or 4d) of four neighboring light-emitting elements arranged around intersections of the electrical buses and cross-connections. Two light-emitting elements of each quad cell are formed on each side of an electrical bus (e.g., pairs 10a, 10c and 10b, 10d formed on opposite sides of electrical bus 14a in quad cell 4a) and two OLED elements of each quad cell being formed on each side of an electrical cross-connection (e.g., pairs 10a, 10b and 10c, 10d formed on opposite sides of electrical cross-connection 12a in quad cell 4a). Each of the light-emitting elements of each quad cell are connected to the electrical bus or electrical cross-connection separating the light-emitting elements of the quad cell, and each quad cell shares a common electrical bus or cross-connection with an adjacent quad cell (e.g., quad cell 4a shares a common electrical bus 14a with adjacent quad cell 4b, and quad cell 4a shares a common electrical cross-connection 12a with adjacent quad cell 4c). Adjacent quad cells sharing a common electrical bus are not separated by a common cross-connection and neighboring quad cells sharing a common cross-connection are not separated by a common electrical bus. This arrangement forms a group of four light-emitting elements located in the four quadrants formed by the intersection of the electrical buses 14a, 14b and the electrical cross-connections 12a, 12b. The arrangement of light-emitting elements, electrical buses, and electrical cross-connections in accordance with the present invention enable an optimized combination of power distribution and light-emitting element aperture ratio. In one embodiment, the electroluminescent layers include organic electroluminescent materials that comprise an organic light-emitting diode and the light-emitting elements may, therefore, be referred to as OLED elements.

Figure 5:
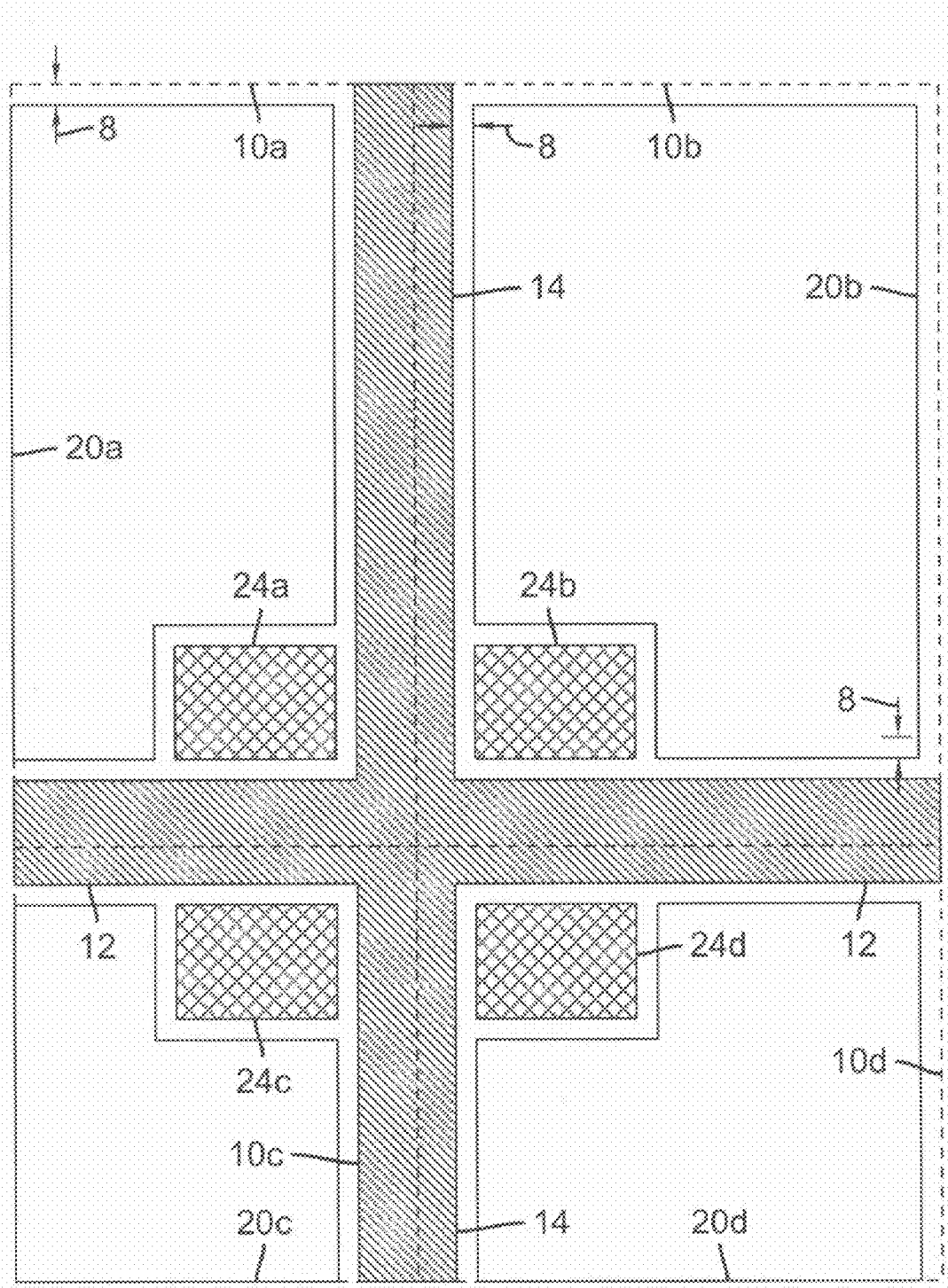
FIG. 5 illustrates a top view of an OLED device according to another embodiment of the present invention.

As further illustrated in FIG. 1, the light-emitting elements (10a, 10c) on one side of the electrical bus 14a may have a reflected layout relative to the light-emitting elements (10b, 10d) on the other side of the electrical bus 14a, and the light-emitting elements (10a, 10b) on one side of the electrical cross-connection 12a may have a reflected layout of the light-emitting elements (10c, 10d) on the other side of the electrical cross-connection 12a. As employed in the present invention, a reflected layout refers to a layout in which the locations of the light-emissive areas 20 and the electronic components 24 in each light-emitting element 10 are approximately reflected with respect to the electrical bus 14 and the electrical cross-connection 12. The reflected layout can be a mirror image wherein the location of each component in a light-emitting element 10 is in a location that is the mirror image of the corresponding element in another light-emitting element 10. However, according to the present invention, a strict mirror image is not required, for example the light-emitting areas may be of different sizes as shown in FIG. 5. Moreover, connections between the electronic components 24 in each light-emitting element 10 and the electrical bus 14 and/or the electrical cross-connection 12 may be positioned in different locations. For example, referring to FIG. 2, a connection 22 may be formed between the electronic components 24 in one light-emitting element 10 and an electrical bus 14 through a via 16 in one location for one light-emitting element 10 but in a reflected or different location to the same electrical bus or to the cross-connection 12 for another light-emitting element 10. Since the electrical bus 14 and the cross-connection 12 are electrically connected, the electrical circuit formed by the connections 22 is much the same and variations of such locations are included in the present invention. Furthermore, according to the present invention, the layout of the electronic components 24 may not be reflected although it may be preferred to employ reflected layouts to simplify the connections to the light-emissive areas 20 and electrical buses 14 and cross-connections 12. Moreover, a reflected layout facilitates connection of all of the light-emitting elements of a quad cell to the electrical bus or the electrical cross-connection of the same quad cell closer to the intersection of the electrical bus and the electrical cross-connection than to edges of the quad cell. This improves the uniformity of current distribution to the individual elements of a quad cell, thereby enhancing uniformity of light emission.

Figure 2:
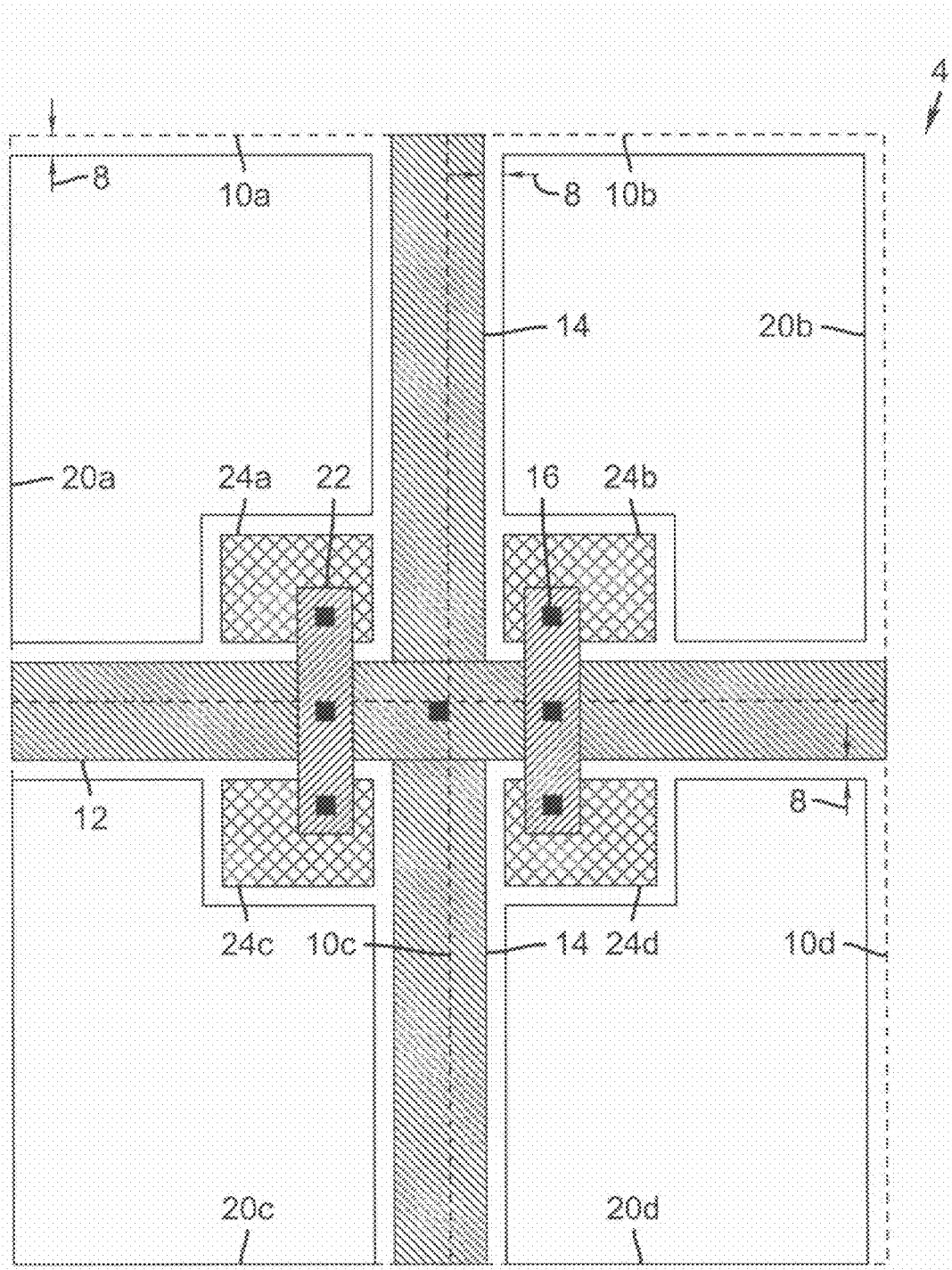
FIG. 2 illustrates a top view of an OLED device according to an alternative embodiment of the present invention.

In general, the light-emitting elements 10 may be laid out in a rectilinear fashion forming orthogonal rows and columns so that the electrical cross-connections 12 are formed at a first common edge of the light-emitting elements 10 and the electrical buses 14 are formed at a second, orthogonal common edge of the light-emitting elements 10. The electrical buses 14 and/or electrical cross-connections 12 may carry a power or a ground signal that is shared among all of the light-emitting elements 10. In various embodiments of the present invention, the electrical buses 14 and cross-connections 12 may be formed in a common step and in a common layer (as shown in FIG. 1) and may comprise the same material, for example a metal for example aluminum, silver, or magnesium or metal alloys thereof. Alternatively, as shown in FIG. 2, the electrical buses 14 and cross-connections 12 may be formed in separate steps and in separate layers and be electrically connected through connection vias 16 at intersections.

The present invention may be employed in either a top- or bottom-emitter configuration. However, because of the limitations in layout for a bottom emitter configuration, the present invention may be more advantageously employed in a bottom emitter configuration.

Figure 6A:
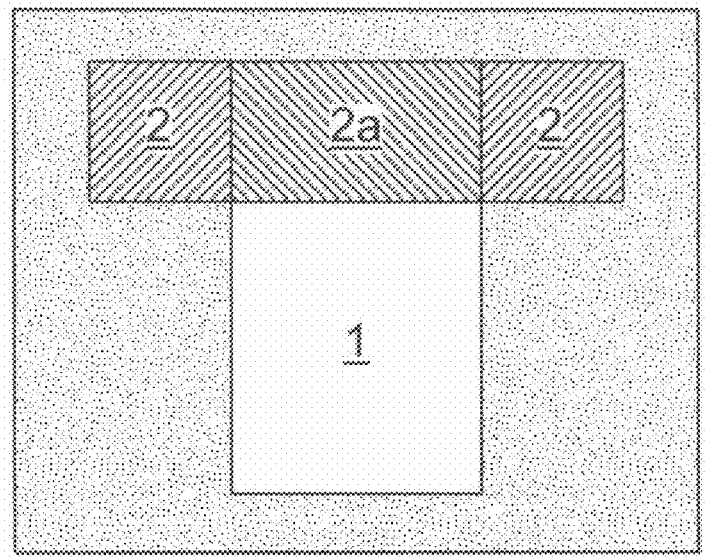
FIGS. 6A and 6B illustrate the performance of a prior-art active-matrix OLED device.
Figure 6B:
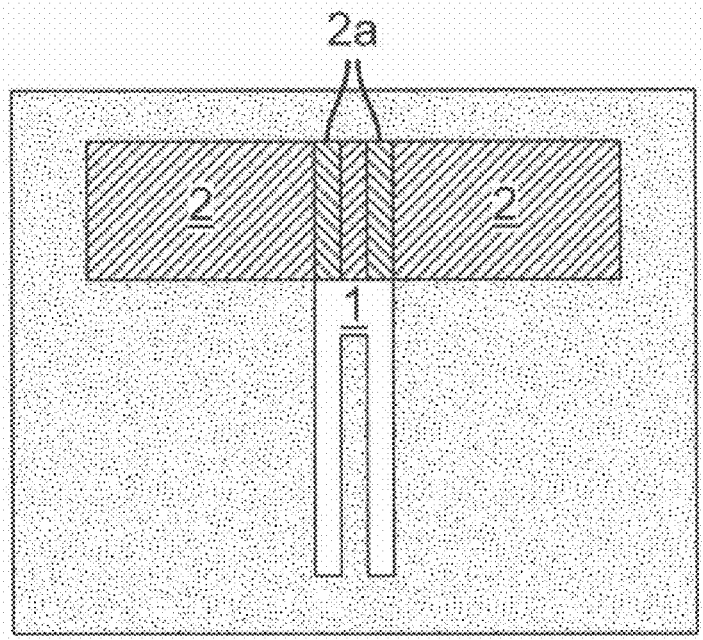

The present invention is advantaged over the prior art because it enables improved power distribution with improved efficiency in layout. Because both the common electrical cross-connections 12 and the electrical buses 14 carry a common signal applied to more than one row or column at the same time, they may be electrically connected and reflected layouts may be employed to reduce the manufacturing tolerance spacing, thereby increasing the area available in the display device. This area may be usefully employed to improve the conductivity of the common electrical cross-connections 12 and the electrical buses 14, improve the aperture ratio of the display, or provide more area for more sophisticated electronic circuitry 24. In the illustration of FIG. 1, the common electrical cross-connections 12 and the electrical buses 14, may be increased in width by 25% relative to the use of two separate buses while maintaining an equivalent aperture ratio. If the electrical cross-connections 12 and the electrical buses 14 carry a signal with significant current (for example a power or a ground connection), the multi-directional (for example orthogonal) connections provide enhanced current-carrying capacity for areas of localized demand. In this case, if a light-emitting element 10 requires more current than can be provided through a single electrical bus 14, additional current from neighboring buses 14 may be provided through the electrical cross-connections 12 near the light-emitting element 10, thereby improving the uniformity of light output from the electroluminescent device. This improvement in power distribution can reduce visible and unwanted edge effects within a display. For example, a 30% variability in uniformity over a display may be acceptable at low frequency, but at high frequencies, for example at borders between areas of high and low luminance, the uniformity requirement is much more stringent, for example less than 5% (as illustrated in FIGS. 6A and 6B).

It should be noted that the present invention may be usefully employed in any layout wherein four neighboring light-emitting elements share a common power line and wherein the neighboring power line is connected to at least one neighboring power line. As examples of four-element arrangements, three of the elements may be comprised of red, green, and blue light-emitting elements while the fourth light-emitting element may emit green, yellow, cyan, magenta, or white light. Alternatively, the four neighboring elements may be composed of two pairs of complementary colors where the two complementary pairs are chosen from pairs of red/cyan, green/magenta, and blue/yellow light-emitting elements. Further, neighboring arrangements of quad patterns do not necessarily need to be composed of light-emitting elements that emit the same color of light. Instead, for example, one quad arrangement may contain light-emitting elements which emit red, green, blue and white light while a neighboring quad arrangement may contain OLEDs emitting red, green, cyan and white light.

Regardless of the colors of light-emitting elements that are used, the invention is particularly useful when forming a full-color display system where the full-color display system comprises an active-matrix electroluminescent display device, the display device comprising a plurality of light-emitting elements laid out over a substrate, each light-emitting element including a first electrode and a second electrode having one or more electroluminescent layers formed therebetween, at least one electroluminescent layer being light-emitting, the first and second electrodes defining one or more light-emissive areas, at least one of the electrodes being transparent; and electronic components formed on the substrate connected to the first and/or second electrodes for driving the one or more electroluminescent layers to emit light; two or more electrical busses carrying a common signal connected to the light-emitting elements; wherein, the active-matrix electroluminescent device has more than three colors of light-emitting elements and each of the two or more electrical busses provide current to a pixel comprising a group of light-emitting elements that include light-emitting elements that emit the more than three colors of light. Within the full-color display system, the display device is driven by a controller for controlling the pixel to limit the current provided to the more than three colors of light-emitting elements such that the light intensity of at least one of the light-emitting elements, when all four light-emitting elements are employed simultaneously, is lower than the light intensity of the same light-emitting element when the color of light that is being displayed by the pixel is approximately equal to the color of the light-emitting element such that the current provided by each of the electrical busses is less than the sum of the individual peak design currents for each light-emitting element. This system is further advantaged when the electroluminescent display further comprises electrical cross-connections electrically connecting at least two of the electrical buses for better power distribution and when the light-emitting elements on one side of the electrical cross-connection have a reflected layout of the light-emitting elements on the other side of the electrical cross-connection.

In such a display system a controller may be employed for controlling the pixel to limit the current provided to the more than three colors of light-emitting elements such that the light intensity of at least one of the light-emitting elements, when all four light-emitting elements are employed simultaneously, is lower than the light intensity of the same light-emitting element when the color of light that is being displayed is approximately equal to the color of the light-emitting element. In such an embodiment, the two or more electrical buses carrying a common signal connected to the light-emitting elements are not required to provide enough current to provide a peak current to all of the more than three light-emitting elements and therefore the overall area of the power and return lines that are required to achieve a given maximum IR drop is less than the overall area of the power and return lines that would be required if the more than three different color of light-emitting elements did not all share common power and return lines. Further, when two light-emitting elements are formed on each side of the power and return lines, space is not required between elements neighboring on both sides of two power and return lines but is required only between the single power and return line and their neighboring elements. Finally, when two OLED elements are formed on each side of the cross-connections, space is required only between one cross connection and the neighboring elements. As such, a display system having these characteristics is advantaged over the prior art as it demonstrates improved power distribution with a greater efficiency in layout.

Figure 7:
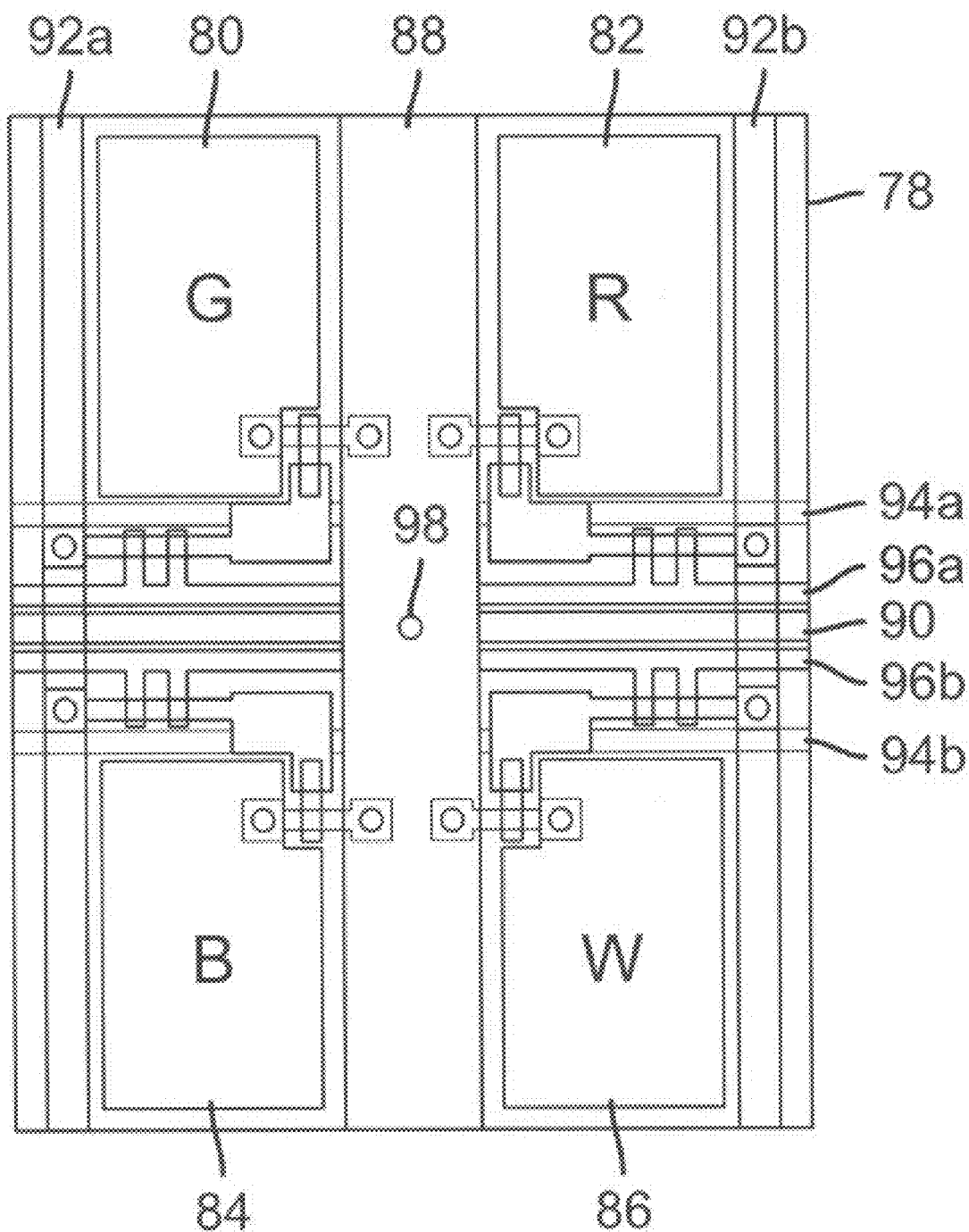
FIG. 7 illustrates a top view of an OLED device having four different colored light-emitting elements according to an embodiment of the present invention.

A portion 78 of one such display is shown in FIG. 7. As shown in this figure, the portion 78 of the display contains four differently colored light-emitting elements, including one for emitting green 80, red 82, blue 84 and white 86 light. An electrical bus power line 88 is shown which provides power to all four light-emitting elements. An electrical cross connection 90 also divides the four light-emitting elements and its effects are shared among these four differently colored light-emitting elements. Although the power line and electrical cross connection are shared, the select lines 92a and 92b are provided for each column of pixels. Further capacitor lines 94a and 94b as well as drive lines 96a and 96b are provided for each row of light-emitting elements within the display device.

It can be desirable to have the power 88 and select lines (92a and 92b) fabricated within a first metallization layer within the display device. As shown, the capacitor lines 94a and 94b, drive lines 96a and 96b as well as the electrical cross connection 90 may be fabricated within a second metallization layer which is separated from the first metallization layer by a dielectric layer. Alternately, the electrical cross connection may be formed in a separate layer, such as an ITO layer that forms the anode in an active-matrix, bottom-emitting electroluminescent device. Note that vias, such as the via 98 connecting the electrical cross connection 90 to the power line 88 allow for cross coupling of the first and second metallization layer.

As noted previously, the fact that the power line 88 and the electrical cross connection 90 are shared among two columns and rows of light-emitting elements respectively, reduces the area of the substrate allocated to these two elements and, more importantly, the amount of area allocated between these elements and neighboring structures within the electroluminescent display device.

Figure 8:
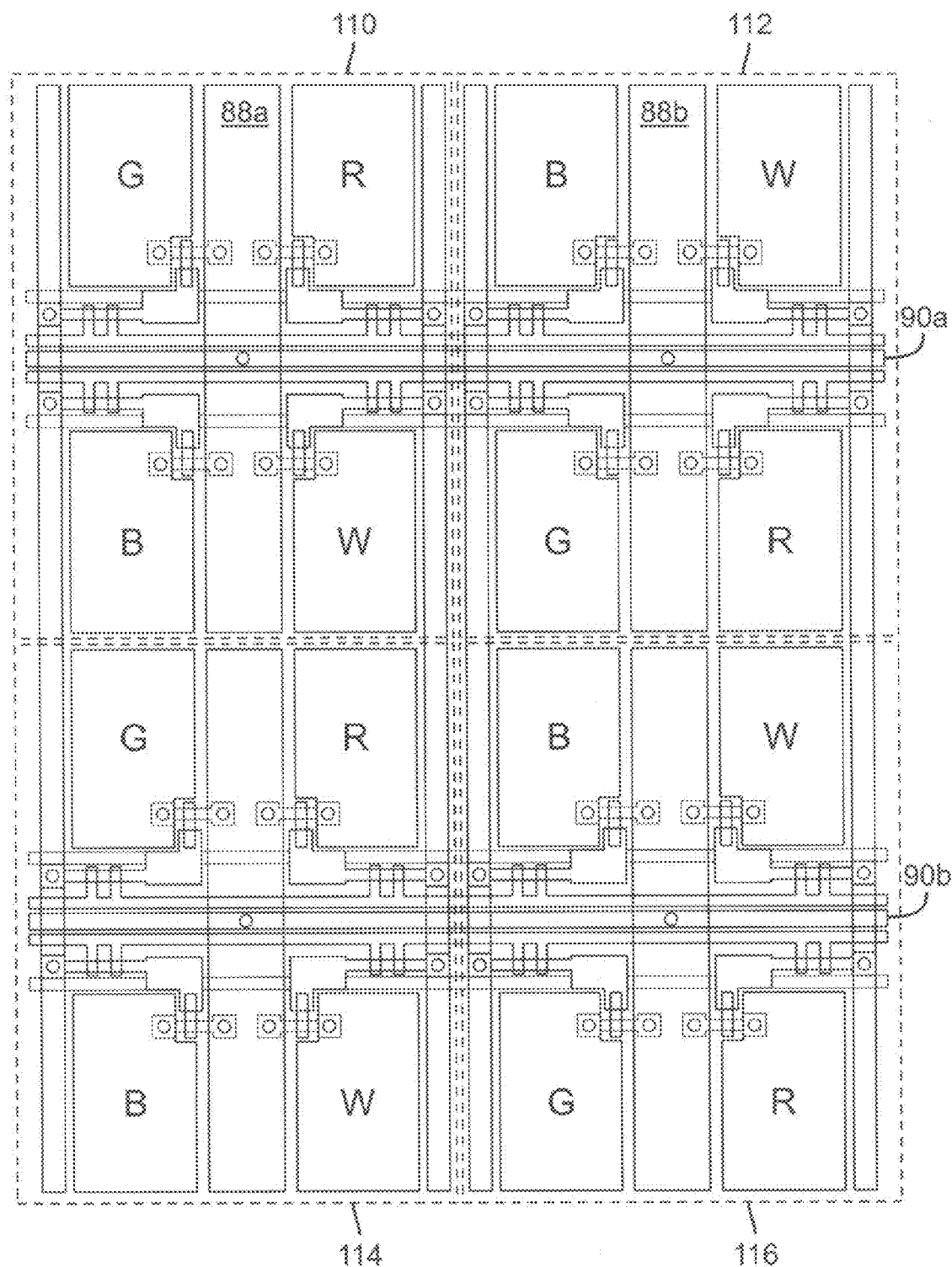
FIG. 8 illustrates a top view of an OLED device having an arrangement of four different colored light-emitting elements with different arrangements in neighboring, quad groupings according to another embodiment of the present invention.

It should also be noted that while one group of light-emitting elements forming a quad cell may be tiled over the entire display substrate, this is not required. FIG. 8 shows a portion of an electroluminescent display device with four quad cells 110, 112, 114, and 116. As shown, quad cells 110 and 114 are powered by line 88a while quad cells 112 and 116 are powered by power line 88b. The electrical cross connection 90a serves to connect the power lines 88a and 88b between quad cells 110 and 112 while the electrical cross connection 90b serves to connect the power lines 88a and 88b between quad cells 114 and 116. However, differences may exist between these quad cells. In fact quad cells 110 and 114 may be formed from light-emitting elements that emit green and red light from the top two light-emitting elements and blue and white light from the bottom two light-emitting elements while quad cells 112 and 116 may be formed from an arrangement of four light-emitting elements that emit blue and white light from the top two light-emitting elements and red and green light from the bottom two light-emitting elements. It should also be noted that the quad cells may be square in shape (i.e., the vertical and horizontal dimensions of the quad cell may be equal) but may alternatively be rectangular in shape. In fact, in some embodiments, it may be desirable to provide rectangular quad cell arrangements, particularly wherein the horizontal or vertical dimension of the quad cell may be twice that of the complementary dimension. In such an embodiment, e.g., pairs of two-light emitting elements within each quad cell may combine to form a substantially square shape.

As noted earlier, such a display device preferably employs more than three colors of OLEDs and a controller for controlling the pixel to limit the current provided to the more than three colors of light-emitting elements such that the light intensity of at least one of the light-emitting elements, when all four light-emitting elements are employed simultaneously, is lower than the light intensity of the same light-emitting element when the color of light that is being displayed is approximately equal to the color of the light-emitting element such that the current provided by each of the electrical buses is less than the sum of the peak currents required to drive each light-emitting element. Preferably, the light intensity of at least one of the light-emitting elements, when all four light-emitting elements are employed simultaneously, is no more than half the light intensity of the same light-emitting element when the color of light that is being displayed is approximately equal to the color of the light-emitting element such that the current provided by each of the electrical buses is significantly less than the sum of the peak currents required to drive each light-emitting element, significantly reducing the required size of the power line. This controller may be any digital, analog, or hybrid processor that is capable of converting an input three-color signal to a four-or-more color signal which is capable of performing a color conversion such that the individual peak design currents of the four OLEDs are not achieved simultaneously. A color conversion algorithm may be employed in such a device to transform an input three-color signal to a four-or-more color signal. Several color conversion algorithms such as this are known in the art, including those discussed in U.S. Pat. No. 6,897,876, entitled "Method for transforming three colors input signals to four or more output signals for a color display", U.S. Pat. No. 6,885,380, entitled "Method for transforming three colors input signals to four or more output signals for a color display", and US 2005/0212728 entitled "Color OLED display with improved power efficiency", which are herein included by reference. Referring again to the display device shown in FIG. 8, a color-conversion process such as shown in FIG. 9 may be used to provide such a color conversion.

Figure 9:
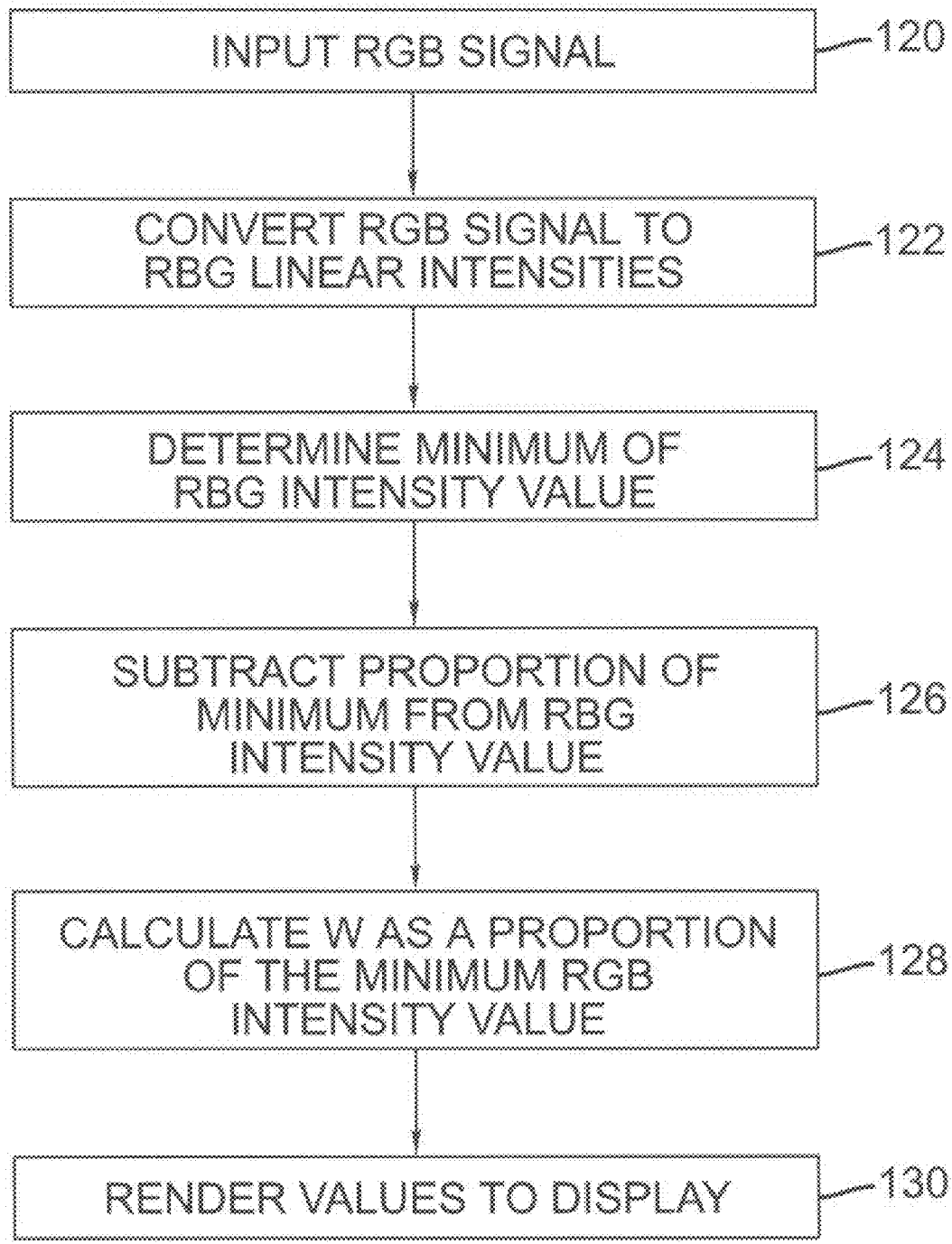
FIG. 9 shows a flow diagram of a color conversion algorithm that may be used in conjunction with a device of the present invention.

As shown in FIG. 9, the RGB signal is input 120 and converted to RGB linear intensity 122 using methods known in the art. These methods often require a linearization of the input RGB signal values, which are typically encoded in a logarithmic space, and may require a color rotation to rotate from the encoding color space to the color space defined by the display primaries. Once the values are expressed as linear intensity values, the minimum of the red, green and blue linear intensity values may be determined 124. A proportion of this minimum is then subtracted 126 from each of the red, green, and blue color channels. A proportion of this same minimum is then used to calculate 128 the white channel value, which will typically be formed as a proportion of this minimum intensity value. It should be noted that subtracting a proportion of a minimum RGB intensity value from the red, green and blue color channels where the proportion is greater than 0 and forming the white channel from this same minimum value ensures that the peak values for the red, green, and blue color channels will be less than their peak value when displaying a fully saturated red, green, or blue primary color. Therefore by employing this means, a color conversion is performed such that the individual peak design currents of the four light-emitting elements are not achieved simultaneously. The resulting red, green, blue and white signal values are then rendered 130 to the display. In an OLED display device, this rendering process often will include a look-up table from linear intensity to voltage that compensates for the nonlinear response of the OLED to a voltage input.

As demonstrated by this detailed embodiment, the present invention may be usefully employed in combination with RGBW OLED display pixel designs employing red, green, blue, and white light-emitting elements. As is known in the art, an RGBW design can be employed to reduce the overall power usage of an OLED display by employing the white light-emitting element in the place of combinations of the colored light-emitting elements to reduce the power required to form any non-saturated color. Such a device configuration is known to be particularly useful when the light-emissive layer within the light-emitting elements emit a broadband light and color filters are used to filter at least a portion of this light to provide the red, green, and blue light-emitting elements. As described above, a controller may be used to control the four colored light-emitting elements such that all four light-emitting elements are not turned on to their maximum luminance simultaneously. If the four sub-pixels are then located on a common electrical bus 14 and cross-connection 12, the peak current requirement of a single electrical bus 14 and cross-connection 12 may be reduced significantly, thereby reducing the peak design current demand for the display and improving the current distribution and uniformity of light output in the OLED device. For example, in a common device, it may be necessary to drive the red, green, and blue light-emitting elements to peak currents of 20 mA, which may be employed to obtain a white color while the same white color can be obtained by driving the white light-emitting element with 8 mA. If a white color is formed using only the RGB elements, the display will be required to provide 60 mA (20 mA for each of the colored light-emitting elements) to each quad cell while if a color conversion according to this invention is applied such that half of the light is produced by the colored light-emitting elements and half is produced with the white light-emitting element (i.e., the proportion that is subtracted 126 and the proportion that is used to calculate 128 are each 0.5), only 34 mAs (half of the sum of the peak red, green, blue and white light-emitting element currents) will be required to be provided to each quad cell. Further, by employing the color conversion as noted above where the proportion of the minimum that is subtracted 126 has a value that is greater than 0 and less than or equal to 1 and wherein the proportion that is used to calculate 128 the minimum has a value less than or equal to the proportion of the minimum that is subtracted 126, the peak current will occur when a secondary color is formed by combining the peak currents for two colored elements (i.e., will have a value of 40 mA). Note that the same white color could be produced using other known color conversion algorithms that effectively add the white luminance to the RGB luminance. In this example, a brighter color would be produced but the display would need to deliver 68 mA to each quad cell, which would require the electrical bus to be twice as large to carry twice the current. Further, if the electrical bus and cross connections provided power to only a single column of light-emitting elements, one column containing green and blue and one column containing red and white light-emitting elements, the electrical bus providing power to the green and blue light-emitting elements would have to be sized to provide up to 40 mA of current while the electrical bus providing power to the red and white light-emitting elements would have to be sized to provide up to 28 mA of current. Note that in this configuration, only considering the bus and cross connections providing power to the green and blue light-emitting elements, the bus structure to these two light-emitting elements must provide as much current, as the bus providing power to all four light-emitting elements within the embodiment of the present invention. Hence, according to the further embodiment of the present invention, a quad cell may comprise a single pixel having four light-emitting elements and the four light-emitting elements may emit white light and three differently colored lights, for example red, green, and blue. To control such an OLED device, the present invention may further comprise a controller for controlling such light-emitting elements to limit the current provided to each quad-cell so that the four light-emitting elements do not simultaneously emit light to their designed maximum capability.

Although the present invention is preferably employed with quad cells forming pixel groups, the quad cells may alternatively comprise light-emitting elements of two or more pixels. The present invention may be employed in a bottom-emitter configuration or in a top-emitter configuration. Pluralities of electrical buses and/or electrical cross-connections may be formed between corresponding pluralities of quad groups. Various groups of quad cells may share electrical buses and/or electrical cross-connections to facilitate layout and/or improve power distribution. For example, one set of quad cells may be connected to one electrical bus while another set may be provided with a separate electrical bus.

The present invention may be employed in display devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

Although this disclosure has been primarily described in detail with particular reference to OLED displays, it will be understood that the same technology can be applied to any active-matrix display device that produces light as a function of the current provided to the light-emitting elements of the display. Within such devices IR drop may occur along a power line that is used to drive a plurality of such light-emitting elements. For example, this disclosure may apply to electroluminescent display devices employing coatable inorganic materials, such as described by Mattoussi et al. in the paper entitled "Electroluminescence from heterostructures of poly (phenylene vinylene) and inorganic CdSe nanocrystals" as described in the Journal of Applied Physics Vol. 83, No. 12 on Jun. 15, 1998, or to displays formed from other combinations of organic and inorganic materials which exhibit electroluminescence and that can be driven by an active matrix pixel driving circuit.

The invention has been described in detail with particular reference to certain preferred embodiments thereof, but it will be understood that variations and modifications can be effected within the spirit and scope of the invention.

PARTS LIST 1 bright area
2, 2a dim area
4, 4a, 4b, 4c, 4d quad cells
8 space
10, 10a, 10b, 10c, 10d OLED element
12, 12a, 12b electrical cross-connection
14, 14a, 14b electrical bus
14' additional bus area
16, 16a, 16b, 16c, 16d connect via
20, 20a, 20b, 20c, 20d light-emitting area
22 connector
24, 24a, 24b, 24c, 24d electronic components
40 insulator
42 insulator
44R, 44G, 44B color filters
44K neutral density filter
50 substrate
52 transparent electrode
54 organic layer(s)
56 reflective electrode
60, 61, 62 colored light
63 broadband light
78 display portion
80 green light-emitting element
82 red light-emitting element
84 blue light-emitting element
86 white light-emitting element
88, 88a, 88b power line
90, 90a, 90b electrical cross connection
92a, 92b select lines
94a, 94b capacitor lines
96a, 96b drive lines
98 via
110, 114 quad cell having first arrangement of light-emitting elements
112, 116 quad cell having second arrangement of light-emitting elements
120 input RGB signal step
122 convert to linear intensity step
124 determine minimum step
126 subtract proportion of minimum step
128 calculate white channel step
130 render step

The invention claimed is:

1. An active-matrix electroluminescent device, comprising:
a plurality of light-emitting elements laid out over a substrate, each light-emitting element including a first electrode and a second electrode having one or more electroluminescent layers formed there-between, at least one electroluminescent layer being light-emitting, at least one of the electrodes being transparent and the first and second electrodes defining one or more light-emissive areas, and electronic components formed on the substrate connected to the first and/or second electrodes for driving the one or more electroluminescent layers to emit light;
a plurality of electrical buses carrying a common signal connected to the light-emitting elements;
a plurality of electrical cross-connections intersecting and electrically connecting the plurality of electrical buses;
wherein the plurality of light-emitting elements are arranged in groups of four light-emitting elements each, each group forming a quad cell of four neighboring light-emitting elements arranged around intersections of the electrical buses and cross-connections, two light-emitting elements of each quad cell being formed on each side of an electrical bus and two light-emitting elements of each quad cell being formed on each side of an electrical cross-connection;
wherein each of the light-emitting elements of each quad cell are connected to the electrical bus or electrical cross-connection separating the light-emitting elements of the quad cell, each quad cell shares a common electrical bus or cross-connection with an adjacent quad cell, and wherein adjacent quad cells sharing a common electrical bus are not separated by a common cross-connection and neighboring quad cells sharing a common cross-connection are not separated by a common electrical bus; and
wherein each quad cell comprises a single pixel having four light-emitting elements, a first light-emitting element emitting red light, a second light-emitting element emitting green light, a third light-emitting element emitting blue light, and a fourth light-emitting element emitting white, cyan, yellow, or magenta light.

2. The active matrix device of claim 1, wherein the light-emitting elements of a quad cell on one side of an electrical bus or cross-connection have a reflected layout of the light-emitting elements of the quad cell on the other side of the electrical bus or cross connection.

3. The active matrix device of claim 1, wherein the light-emitting elements of a quail cell on one side of an electrical bus have a reflected layout of the light-emitting elements of the quad cell on the other side of the electrical bus and the light emitting elements on one side of the electrical cross-connection of the same quad cell have a reflected layout of the light-emitting elements of the quad cell on the other side of the electrical cross-connection.

4. The active matrix device of claim 3, wherein each of the light-emitting elements of a quad cell are connected to the electrical bus or the electrical cross-connection of the same quad cell closer to the intersection of the electrical bus and the electrical cross-connection than to edges of the quad cell.

5. The active-matrix electroluminescent device of claim 1, wherein the electrical cross-connections are formed orthogonal to the electric buses.

6. The active-matrix electroluminescent display device of claim 1, wherein the electrical buses carry a power or a ground signal.

7. The active-matrix electroluminescent device of claim 1, wherein the electrical buses and cross-connections are formed in a common step and in a common layer.

8. The active-matrix electroluminescent device of claim 1, wherein the electrical buses and cross-connections are formed in separate steps and in separate layers and are electrically connected through connection vias at each intersection.

9. The active-matrix electroluminescent device of claim 1, further comprising a controller for driving the light-emitting elements of the pixel in combination so that the individual peak design currents for each light-emitting element are not employed simultaneously for all four light-emitting elements of the same pixel.

10. The active-matrix electroluminescent device of claim 1, further comprising a controller for driving the light-emitting elements of the pixel in combination to limit the current provided to each quad-cell such that the light intensity of at least one of the light-emitting elements, when all four light-emitting elements are employed simultaneously, is lower than the light intensity of the same light-emitting element when the color of light that is being displayed is approximately equal to the color of the light-emitting element.

11. The active-matrix electroluminescent device of claim 1, wherein the quad cell groups of light-emitting elements are rectangular in shape.

12. The active-matrix electroluminescent device of claim 1, wherein the light-emitting elements comprise OLEDs.

* * * * *